United States Patent
Im et al.

(10) Patent No.: US 7,619,942 B2
(45) Date of Patent: Nov. 17, 2009

(54) MULTI-PORT MEMORY DEVICE HAVING SELF-REFRESH MODE

(75) Inventors: Jae-Hyuk Im, Kyoungki-do (KR); Chang-Ho Do, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 321 days.

(21) Appl. No.: 11/540,381

(22) Filed: Sep. 28, 2006

(65) Prior Publication Data

US 2007/0070767 A1    Mar. 29, 2007

(30) Foreign Application Priority Data

Sep. 29, 2005    (KR) ...................... 10-2005-0090904
May 31, 2006    (KR) ...................... 10-2006-0049135

(51) Int. Cl.
*G11C 7/00*    (2006.01)

(52) U.S. Cl. ............ 365/222; 365/189.05; 365/230.05; 365/230.08; 365/233.1

(58) Field of Classification Search ................ 365/222, 365/189.05, 230.05, 230.08, 233.1
See application file for complete search history.

(56) References Cited

U.S. PATENT DOCUMENTS

| 6,545,905 | B2 | 4/2003 | Jain | |
|---|---|---|---|---|
| 6,711,081 | B1 | 3/2004 | Jain | |
| 6,809,984 | B2 | 10/2004 | Nagano | |
| 6,885,608 | B2 | 4/2005 | Nagano | |
| 6,961,278 | B2 * | 11/2005 | Jeong | .......................... 365/222 |
| 7,492,658 | B2 * | 2/2009 | Oh | .............................. 365/222 |
| 2004/0066697 | A1 | 4/2004 | Nagano | |
| 2004/0233756 | A1 * | 11/2004 | Choi | .......................... 365/222 |

FOREIGN PATENT DOCUMENTS

| JP | 10-3785 | 1/1998 |
|---|---|---|
| JP | 2003-317469 | 11/2003 |
| JP | 2004-127440 | 4/2004 |
| KR | 1998-082438 | 12/1998 |
| KR | 2003-0050181 | 6/2003 |
| KR | 10-2005-0104224 | 11/2005 |

* cited by examiner

*Primary Examiner*—Pho M Luu
*Assistant Examiner*—Toan Le
(74) *Attorney, Agent, or Firm*—Blakely Sokoloff Taylor & Zafman (57) ABSTRACT

The multi-port memory device includes a mode input/output controller for receiving a flag signal and generating a self-refresh entry signal and a self-refresh escape signal, a refresh interval signal generator for providing a self-refresh interval signal notifying a self-refresh interval in response to the self-refresh entry signal and the self-refresh escape signal, a refresh cycle signal generator for periodically generating a cycle-pulse signal during an activation of the self-refresh interval signal, an internal refresh signal generator for producing an internal refresh signal in response to the self-refresh entry signal and the cycle-pulse signal, and an internal address counter for generating an internal address in response to the internal refresh signal.

11 Claims, 12 Drawing Sheets

MULTI-PORT MEMORY DEVICE HAVING SELF-REFRESH MODE

FIELD OF THE INVENTION

The present invention relates to semiconductor design technologies, and more particularly, to a multi-port memory device capable of performing a self-refresh operation by only a single flag signal or test signal.

DESCRIPTION OF RELATED ART

Generally, data is stored in cell capacitors in a charge form in Dynamic Random Access Memory (DRAM), but such charge may be lost due to a leakage current and the like. Therefore, it is required to conduct repeated processes of reading and amplifying the stored data and again writing it in regular cycles before the data becomes completely lost. This is called a refresh operation.

A refresh is generally classified into an auto-refresh and a self-refresh. The auto-refresh implies a refresh that is carried out by taking an auto-refresh command from outside every certain time. The self-refresh is an operation mode devised to reduce power consumption among lots of operation modes of a semiconductor memory device, wherein only a self-refresh entry command is provided from an external chip set to the memory device without giving any other commands thereto. Thereafter, the semiconductor memory device itself conducts the refresh operation by an inner timer until receipt of a self-refresh escape command. During the self-refresh mode, devices such as an input buffer and a delay-lock loop which are not related to the self-refresh are turned off in order to minimize power consumption.

Figure 1:
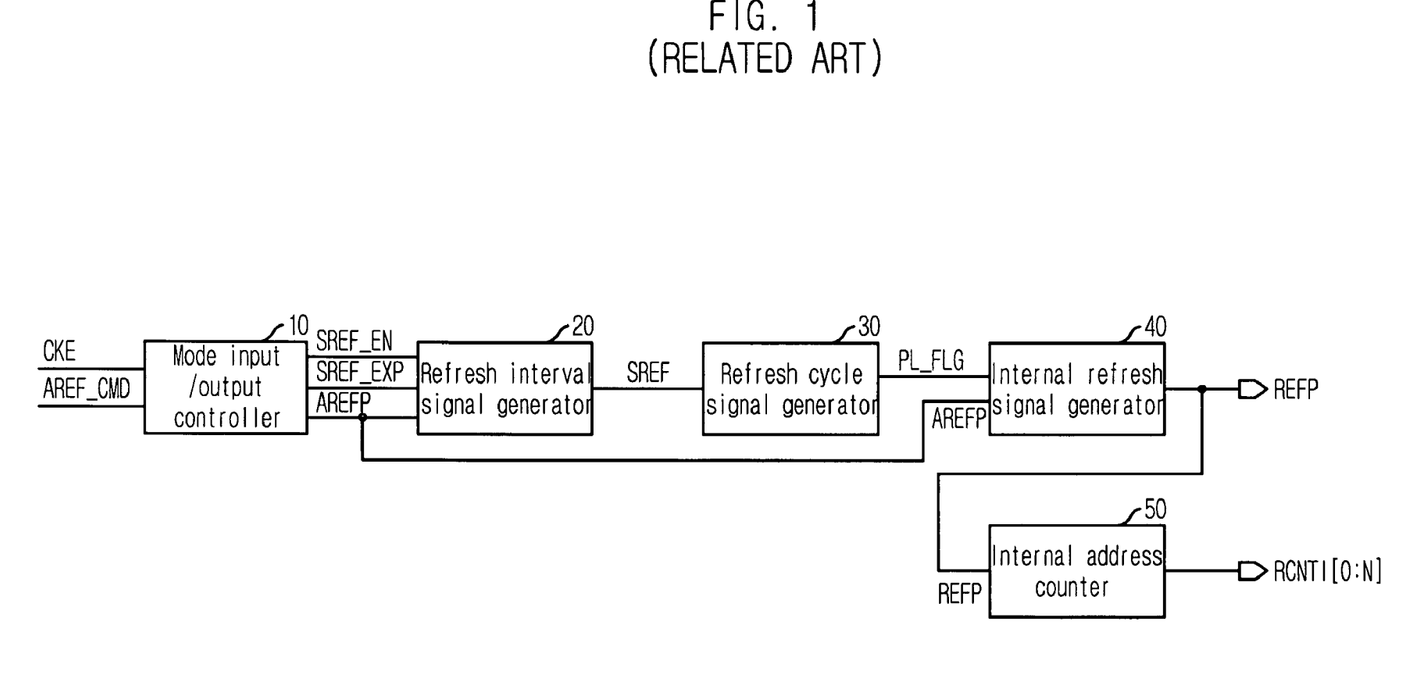
FIG. 1 shows a block diagram of a conventional semiconductor memory device having a self-refresh mode.

FIG. 1 shows a block diagram of a conventional semiconductor memory device with a self-refresh mode.

Referring to FIG. 1, the conventional semiconductor memory device includes a mode input/output controller 10 for receiving a clock enable signal CKE and an auto-refresh command AR (or AREF_CMD) and generating an internal auto-refresh signal AREFP, a self-refresh entry signal SREF_EN and a self-refresh escape signal SREF_EXP, a refresh interval signal generator 20 for taking the internal auto-refresh signal AREFP, the self-refresh entry signal SREF_EN and the self-refresh escape signal SREF_EXP and producing a self-refresh interval signal SREF notifying a self-refresh interval, a refresh cycle signal generator 30 for periodically providing a cycle-pulse signal PL_FLG during an activation of the self-refresh interval signal SREF, an internal refresh signal generator 40 for activating an internal address REFP in response to the internal auto-refresh signal AREFP and the cycle-pulse signal PL_FLG, and an internal address counter 50 for increasing a row address by bit units in response to the internal refresh signal REFP to provide an internal address RCNTI[0:N].

For reference, the clock enable signal CKE is a signal indicating whether a clock to synchronize an operation of the semiconductor memory device is valid or not. Therefore, when only the clock enable signal is inactivated, the semiconductor memory device enters a power down mode to minimize its own power consumption.

Figure 2:
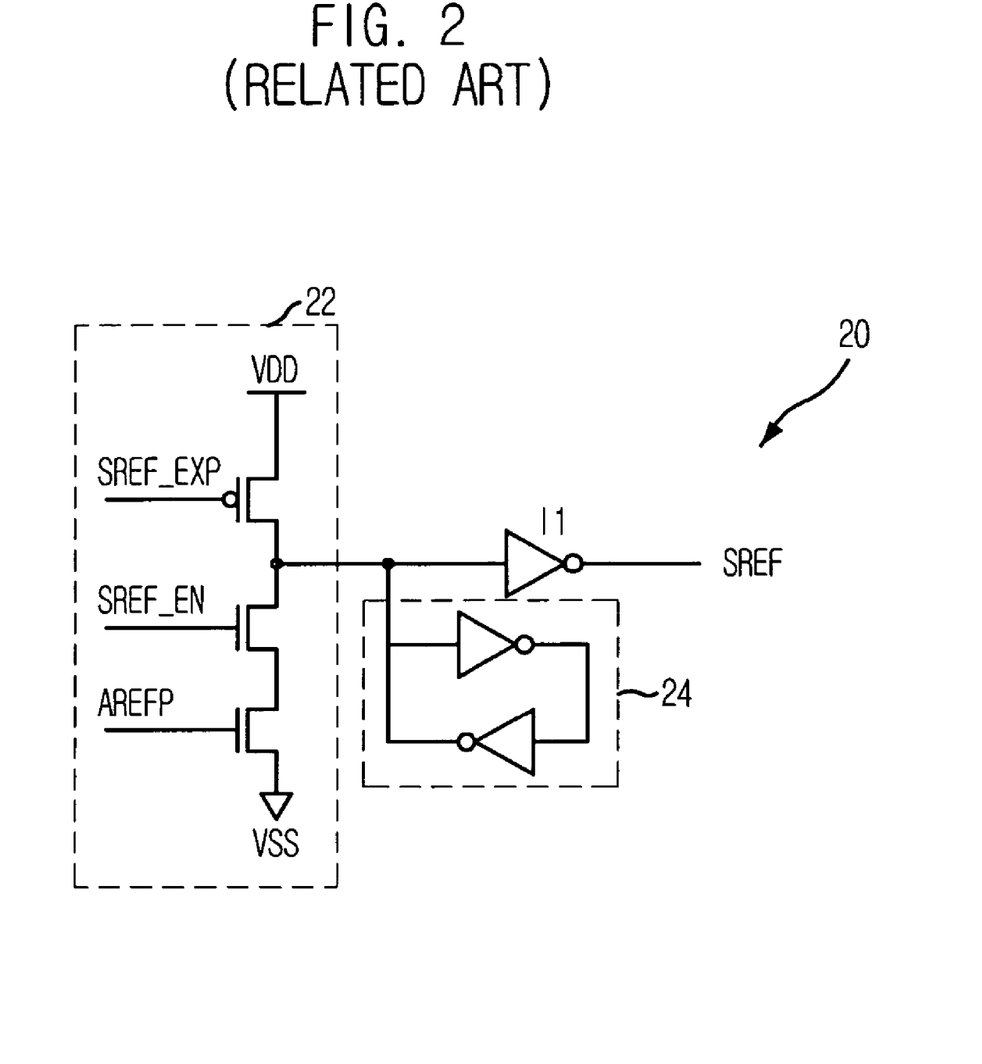
FIG. 2 is an internal circuit diagram of the refresh interval signal generator shown in FIG. 1.

FIG. 2 is an internal circuit diagram of the refresh interval signal generator 20 shown in FIG. 1.

Referring to FIG. 2, the refresh interval signal generator 20 is provided with a signal generator 22 for activating an output signal when the self-refresh entry signal SREF_EN and the internal auto-refresh signal AREFP are activated and inactivating it when the self-refresh escape signal SREF_EXP is activated, a latch 24 for latching the output signal of the signal generator 22, and an inverter I1 for inverting the output signal of the signal generator 22 to provide the self-refresh interval signal SREF.

The following is a brief operation explanation of the refresh interval signal generator 20.

First of all, when the self-refresh entry signal SREF_EN and the internal auto-refresh signal AREFP are all activated to a logic high level, the signal generator 22 activates an output signal to a logic low level. Then, the latch 24 latches the output signal of the signal generator 22 and the inverter I1 inverts the same to activate the self-refresh interval signal SREF to a logic high level.

In the meantime, when the self-refresh escape SREF_EXP is activated to a logic low level, the signal generator 22 inactivates an output signal to a logic high level. Then, the latch 24 latches the output signal of the signal generator 22 and the inverter I1 inverts it to inactivate the self-refresh interval signal SREF.

In other words, when the self-refresh entry signal SREF_EN and the internal auto-refresh signal AREFP are activated, the refresh interval signal generator 20 activates the self-refresh interval signal SREF and keeps the activation state until the self-refresh escape signal SREF_EXP is applied thereto. After that, when the self-refresh escape signal SREF_EXP is inputted, the refresh interval signal generator 20 inactivates the self-refresh interval signal SREF.

Figure 3:
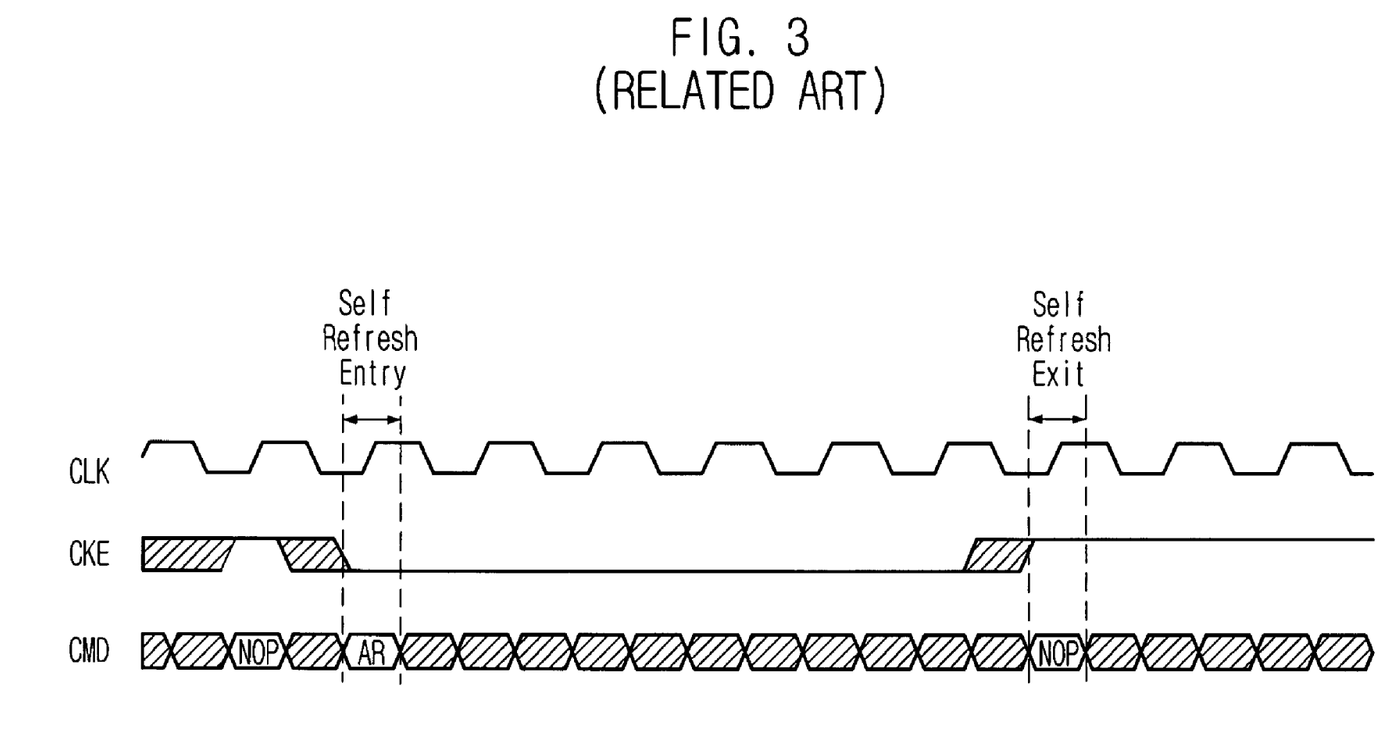
FIG. 3 offers an operational waveform of the semiconductor memory device with the self-refresh mode shown in FIGS. 1 and 2.

FIG. 3 offers an operation waveform of the semiconductor memory device with the self-refresh mode, as shown in FIGS. 1 and 2. An operation of the self-refresh mode will be explained below in detail with reference to FIG. 3.

As shown in FIG. 3, the clock enable signal CKE is first transited to a logic low level, and also, the auto-refresh command AR is activated.

Then, in response to the logic low level transition of the clock enable signal CKE, the mode input/output controller 10 activates the self-refresh entry signal SREF_EN, and in response to the auto-refresh command AR, it activates the internal auto-refresh signal AREFP.

Subsequently, the internal refresh signal generator 40 generates the internal refresh signal REFP in response to the internal auto-refresh signal AREFP.

And then, the internal address counter 50 increases a row address by one bit whenever the internal refresh signal REFP is activated, to thereby output the internal address RCNTI[0:N].

In response to the activation of the internal auto-refresh signal AREFP and the self-refresh entry signal SREF_EN, the self-refresh interval signal generator 20 activates the self-refresh interval signal SREF and maintains such state until the self-refresh escape signal SREF_EXP is applied thereto.

Thereafter, the refresh cycle signal generator 30 periodically activates the cycle-pulse signal PL_FLG during the activation of the self-refresh interval signal SREF.

In succession, the interval refresh signal generator 40 activates a new internal refresh signal REFP of pulse shape whenever the cycle-pulse signal PL_FLG is inputted thereto.

Then, the internal address counter 50 increases a row address by one bit whenever the internal refresh signal REFP is activated, to thereby provide the internal address RCNTI[0:N].

For reference, the internal refresh signal REFP is applied to each bank so that a word line corresponding to the internal address RCNTI[0:N] is active and thus the self-refresh is performed.

As described above, the conventional semiconductor memory device enters the self-refresh mode to perform such mode when the clock enable signal CKE inactivated to a logic low level is applied thereto together with the auto-refresh command AR, and thereafter, ends the execution of the self-refresh mode when the clock enable signal CKE is activated to a logic high level.

Namely, the conventional semiconductor memory device enters the self-refresh mode when the clock enable signal is applied thereto, together with the auto-refresh command. This is to distinguish from a case of entering the power down mode when only the clock enable signal is inactivated.

In this regard, the applicant of the present invention filed a multi-port memory device which is assigned Korean Patent Application No. 10-2006-32948.

However, this multi-port memory device does not perform the power down mode and the self-refresh mode separately, and therefore, there has been a need of a new self-refresh driving method.

SUMMARY OF THE INVENTION

It is, therefore, an object of the present invention to provide a multi-port memory device capable of performing a self-refresh operation in response to a single flag signal or test signal.

In accordance with the present invention, there is provided a multi-port memory device including: a mode input/output controller for receiving a flag signal and generating a self-refresh entry signal and a self-refresh escape signal; a refresh interval signal generator for providing a self-refresh interval signal notifying a self-refresh interval in response to the self-refresh entry signal and the self-refresh escape signal; a refresh cycle signal generator for periodically generating a cycle-pulse signal during an activation of the self-refresh interval signal; an internal refresh signal generator for producing an internal refresh signal in response to the self-refresh entry signal and the cycle-pulse signal; and an internal address counter for generating an internal address in response to the internal refresh signal.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be set forth in detail with reference to the accompanying drawings so that the invention can be readily carried out by those in the art to which the invention pertains.

Figure 4:
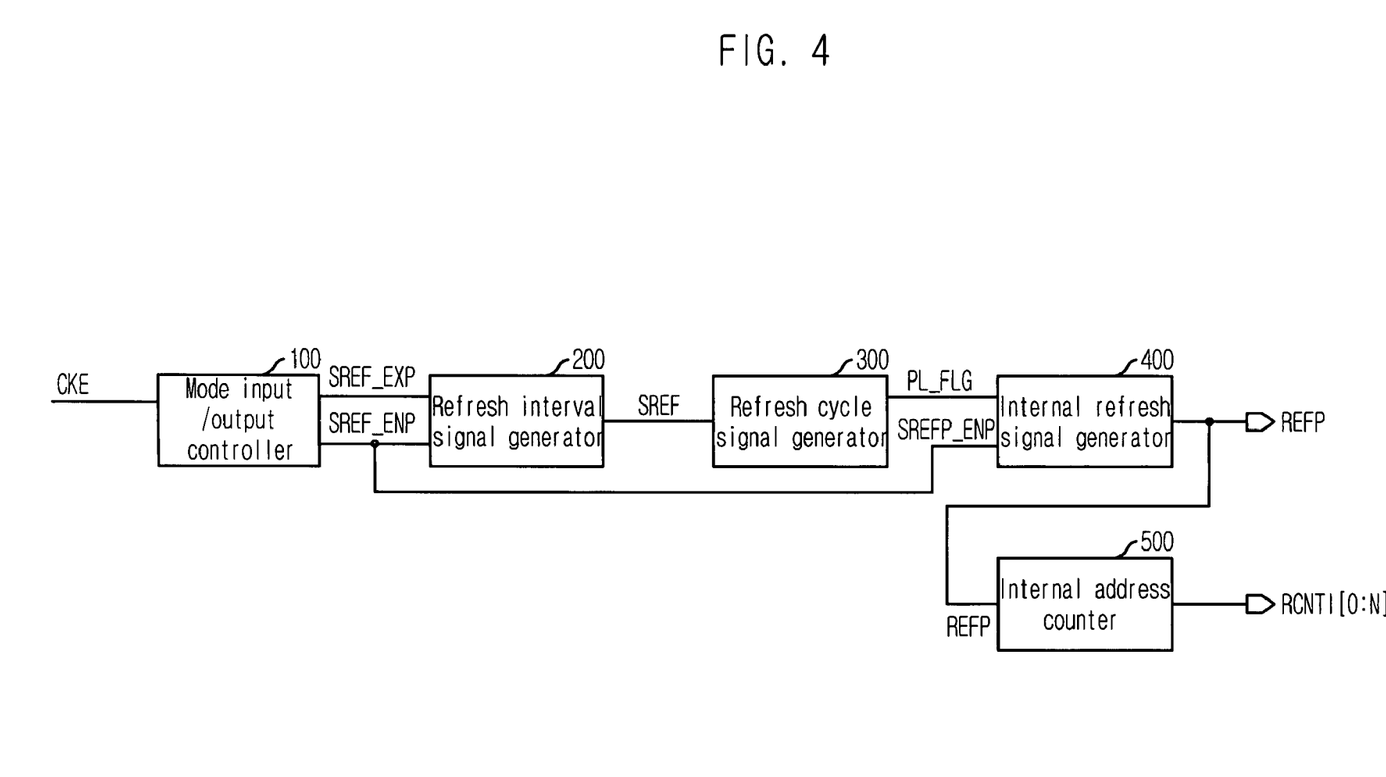
FIG. 4 is a block diagram showing a configuration of a multi-port memory device having a self-refresh mode in accordance with a first embodiment of the present invention.

FIG. 4 is a block-diagram showing a configuration of a self-refresh apparatus for a multi-port memory device in accordance with a first embodiment of the present invention.

Referring to FIG. 4, the self-refresh apparatus in accordance with the first embodiment of the present invention includes a mode input/output controller 100 for receiving a clock enable signal CKE and generating a self-refresh entry signal SREF_EN and a self-refresh escape signal SREF_EXP, a refresh interval signal generator 200 for producing a self-refresh interval signal SREF notifying a self-refresh interval in response to the self-refresh entry signal SREF_EN and the self-refresh escape signal SREF_EXP, a refresh cycle signal generator 300 for periodically providing a cycle-pulse signal PL_FLG during an activation of the self-refresh interval signal SREF, an internal refresh signal generator 400 for generating an internal address REFP in response to the self-refresh entry signal SREF_EN and the cycle-pulse signal PL_FLG, and an internal address counter 500 for producing an internal address RCNTI[0:N] in response to the internal refresh signal REFP.

In comparison with the conventional device shown in FIG. 1, it can be seen that the self-refresh apparatus for the multi-port memory device of the present invention allows the mode input/output controller 100 that senses an entry into a self-refresh mode to take only the clock enable signal CKE in order to generate only the self-refresh entry signal SREF_EN and the self-refresh escape signal SREF_EXP, and also the refresh interval signal generator 200 to receive only the self-refresh entry signal SREF_EN and the self-refresh escape signal SREF_EXP.

In other words, it can be known that the self-refresh apparatus according to the first embodiment of the present invention accepts only the clock enable signal CKE and enters the self-refresh mode or escapes therefrom, thereby enabling a simpler circuit implementation.

As can be seen from the above, other blocks except for the mode input/output controller 100 and the refresh interval signal generator 200 are the same as those of the conventional device. Accordingly, the mode input/output controller 100 and the refresh interval signal generator 200 will be described below in detail with reference to their detailed circuit diagrams.

Figure 5:
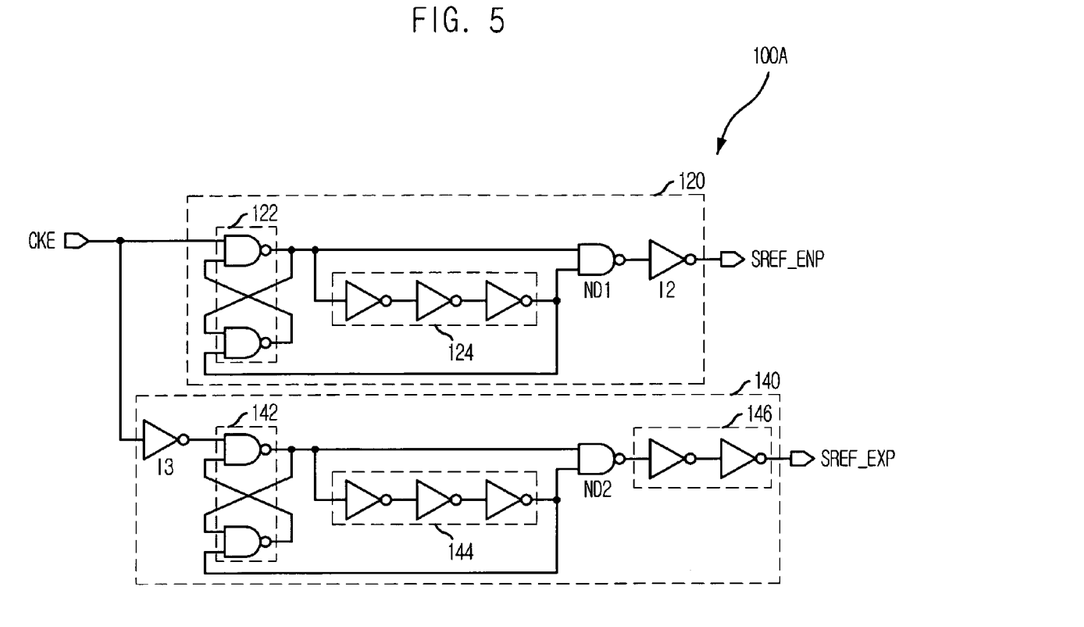
FIG. 5 illustrates an internal circuit diagram of the mode input/output controller shown in FIG. 4.

FIG. 5 illustrates an internal circuit diagram of the mode input/output controller 100 of FIG. 4, designated by reference numeral 100A.

Referring to FIG. 5, the mode input/output controller 100A is provided with a self-refresh entry signal generator 120 for sensing an inactivation of the clock enable signal CKE to generate the self-refresh entry signal SREF_EN, and a self-refresh escape signal generator 140 for sensing an activation of the clock enable signal CKE to produce the self-refresh escape signal SREF_EXP.

More specifically, the self-refresh entry signal generator 120 is composed of an RS latch 122 for taking the clock enable signal CKE as a set signal and a feedback signal as a reset signal, an inversion delay circuit 124 for delaying and inverting a positive output of the RS latch 122 to output the feedback signal, a NAND gate ND1 for taking and NAND-operating the positive output and the feedback signal, an inverter I2 for inverting an output signal of the NAND gate ND1 to generate the self-refresh entry signal SREF_EN.

In the meantime, the self-refresh escape signal generator 140 is composed of an inverter I3 for inverting the clock enable signal CKE, an RS latch 142 for taking an output signal of the inverter I3 as a set signal and a feedback signal as a reset signal, an inversion delay circuit 144 for delaying and inverting a positive output of the RS latch 142 to output the feedback signal, a NAND gate ND2 for accepting and NAND-operating the positive output and the feedback signal, a delay circuit 146 for delaying an output signal of the NAND gate ND2 to create the self-refresh escape signal SREF_EXP.

The following is a brief operation description of the mode input/output controller 100A.

First of all, the clock enable signal CKE is inactivated to a logic low level.

Next, in response to the inactivation of the clock enable signal CKE, the RS latch 122 in the self-refresh entry signal generator 120 activates the self-refresh entry signal SREF_EN to a logic high level, and after a delay time by the inversion delay circuit 144, the feedback signal becomes a logic low level and thus the self-refresh entry signal SREF_EN becomes inactivated.

And then, when the clock enable signal CKE is activated to a logic high level, the RS latch 142 in the self-refresh escape signal generator 140 activates the self-refresh escape signal SREF_EXP to a logic low level, and after a delay time by the inversion delay circuit 144, inactivates it to a logic high level.

That is, when the clock enable signal CKE is transited from a logic high level to a logic low level, the mode input/output controller 100A senses such transition and triggers the self-refresh entry signal SREF_EN of pulse shape to be in a high active state. And when the clock enable signal CKE is again activated to a logic high level, it senses such state and causes the self-refresh escape signal SREF_EXP of pulse shape to be in a low active state.

Therefore, the self-refresh apparatus having the mode input/output controller 100A as mentioned above enters the self-refresh mode or escapes therefrom by sensing only a change of logic level of the clock enable signal CKE.

Figure 6:
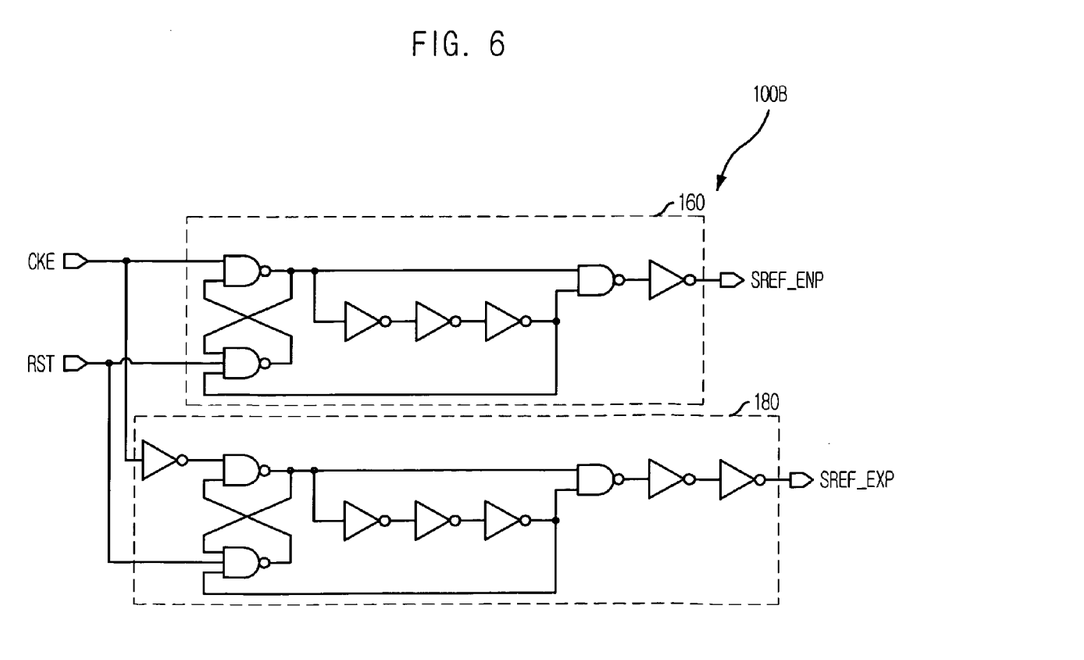
FIG. 6 illustrates an internal circuit diagram of the refresh interval signal generator shown in FIG. 4.

FIG. 6 exemplifies an internal circuit diagram of the refresh interval signal generator 200 shown in FIG. 4.

Referring to FIG. 6, the refresh interval signal generator 200 is provided with a signal generator 220 for activating an output signal in response to the self-refresh entry signal SREF_EN and inactivating it in response to the self-refresh escape signal SREF_EXP, a latch 240 for latching an output signal of the signal generator 220, and an inverter I4 for inverting the output signal of the signal generator 240 to generate the self-refresh interval signal SREF.

The signal generator 220 is composed of a PMOS transistor PM1 for taking the self-refresh escape signal SREF_EXP via its gate and having a source-drain path between an external voltage VDD and an output node N1, and an NMOS transistor NM1 for accepting the self-refresh entry signal SREF_EN via its gate and having a drain-source path between the output node N1 and a ground voltage VSS, wherein a voltage on the output node N1 is provided as an output signal.

The following is a brief operation explanation of the refresh interval signal generator 200.

First of all, when the self-refresh signal SREF_EN is activated to a logic high level, the signal generator 220 activates an output signal to a logic low level and keeps the state until the self-refresh escape signal SREF_EXP is applied thereto. Then, the latch 240 latches the output signal of the signal generator 220 and the inverter I4 inverts the output signal to provide the self-refresh interval signal SREF activated to a logic high level.

Meanwhile, when the self-refresh escape signal SREF_EXP is activated to a logic low level, the signal generator 220 inactivates an output signal and keeps the state until the self-refresh entry signal SREF_EN is applied thereto. Then, the latch 240 latches an output signal of the signal generator 220 and the inverter I4 inverts the output signal to inactivate the self-refresh interval signal SREF.

That is, the refresh interval signal generator 200 activates the self-refresh interval signal SREF in response to the activation of the self-refresh entry signal SREF_EN, and inactivates it when the self-refresh escape signal SREF_EXP is applied. Thus, the self-refresh interval signal SREF is continuously activated to a logic high level during the self-refresh mode, to thereby notify that the current mode is in the self-refresh mode.

Hereinafter, a brief operation description of the self-refresh apparatus shown in FIGS. 4 to 6 will be given.

First of all, when the clock enable signal CKE is inactivated at a logic low level, the mode input/output controller 100 activates the self-refresh entry signal SREF_EN, and then, the refresh interval signal generator 200 activates the self-refresh interval signal SREF. Thereafter, the refresh cycle signal generator 300 activates the cycle-pulse signal PL_FLG of pulse shape at regular cycle intervals during the activation of the self-refresh interval signal SREF. In succession, the interval refresh signal generator 400 creates the internal refresh signal REFP in response to the self-refresh entry signal SREF_EN, and creates the new internal refresh signal REFP of pulse shape whenever the cycle-pulse signal PL_FLG is activated. Then, the internal address counter 500 increases a row address by one bit whenever the internal refresh signal REFP is activated, to thereby output the internal address RCNTI[0: N].

Meanwhile, when the clock enable signal CKE is activated to a logic high level, the mode input/output controller 100 activates the self-refresh escape signal SREF_EXP, and thus, inactivates the self-refresh interval signal SREF. Accordingly, the refresh cycle signal generator 300 is turned off in response to the inactivation of the self-refresh interval signal SREF. In succession, the interval refresh signal generator 400 creates no internal refresh signal REFP because the cycle-pulse signal PL_FLG is not applied thereto. Then, the internal address counter 500 is turned off because the internal refresh signal REFP is also applied thereto.

For reference, although not shown in the figure, the internal refresh signal REFP is applied to each bank to activate a word line corresponding to an internal address RCNTI[0:N], so that the self-refresh is carried out.

The procedure for the self-refresh apparatus of the present invention to enter the self-refresh mode or escape therefrom as set forth above will be roughly illustrated below referring to FIG. 7.

Figure 7:
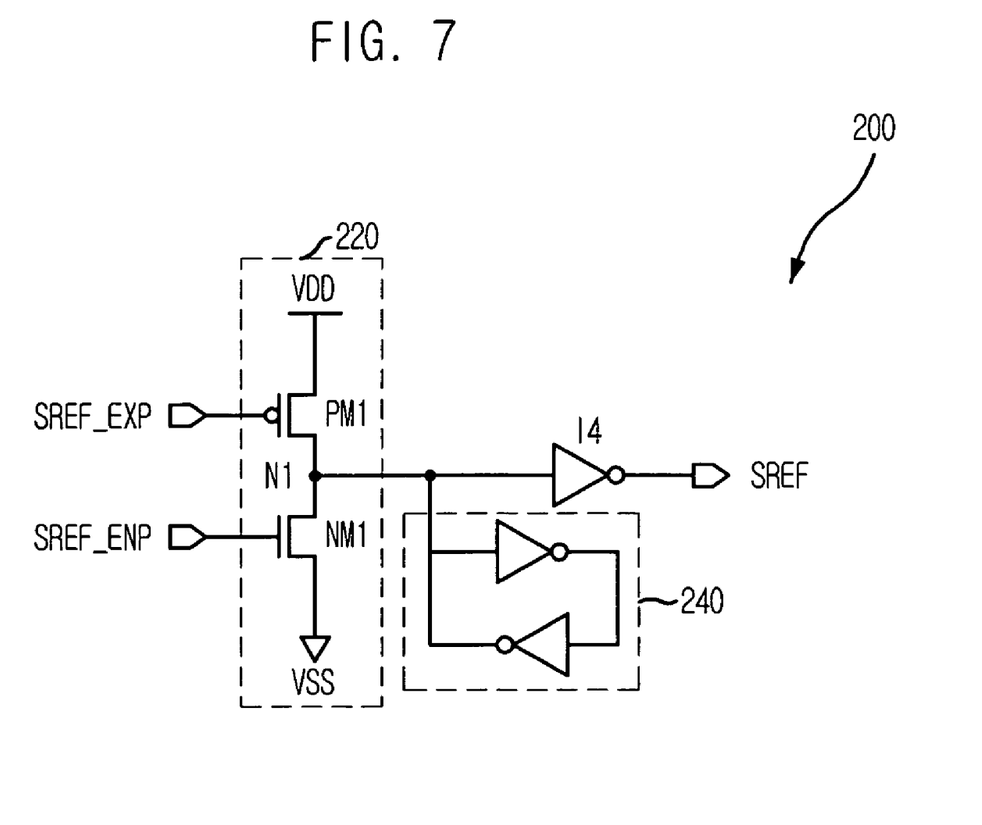
FIG. 7 provides an operational waveform that simply shows a procedure for the multi-port memory device of the present invention to enter a self-refresh mode and escape therefrom.

Referring to FIG. 7, the self-refresh apparatus for the multi-port memory device in accordance with the present invention enters the self-refresh mode when the clock enable signal CKE is at a logic low level, and escapes therefrom when the clock enable signal CKE is activated to a logic high level.

Namely, it can be seen that the present invention enters the self-refresh mode using only the clock enable signal CKE, while the conventional device enters the self-refresh mode by sensing receipt of the auto-refresh command AR together with the clock enable signal CKE.

Therefore, the self-refresh apparatus in accordance with the present invention can be implemented by a simpler circuit configuration compared to the conventional device. Also, the present invention does not require that the input buffer for taking the auto-refresh command AR be always active.

Meanwhile, by applying an initialization signal RST to the mode input/output controller 100, it is possible for the self-refresh entry signal SREF_EN and the self-refresh escape signal SREF_EXP to have certain levels, without any error, upon an initial operation. Details thereof will be provided below referring to the figure.

Figure 8:
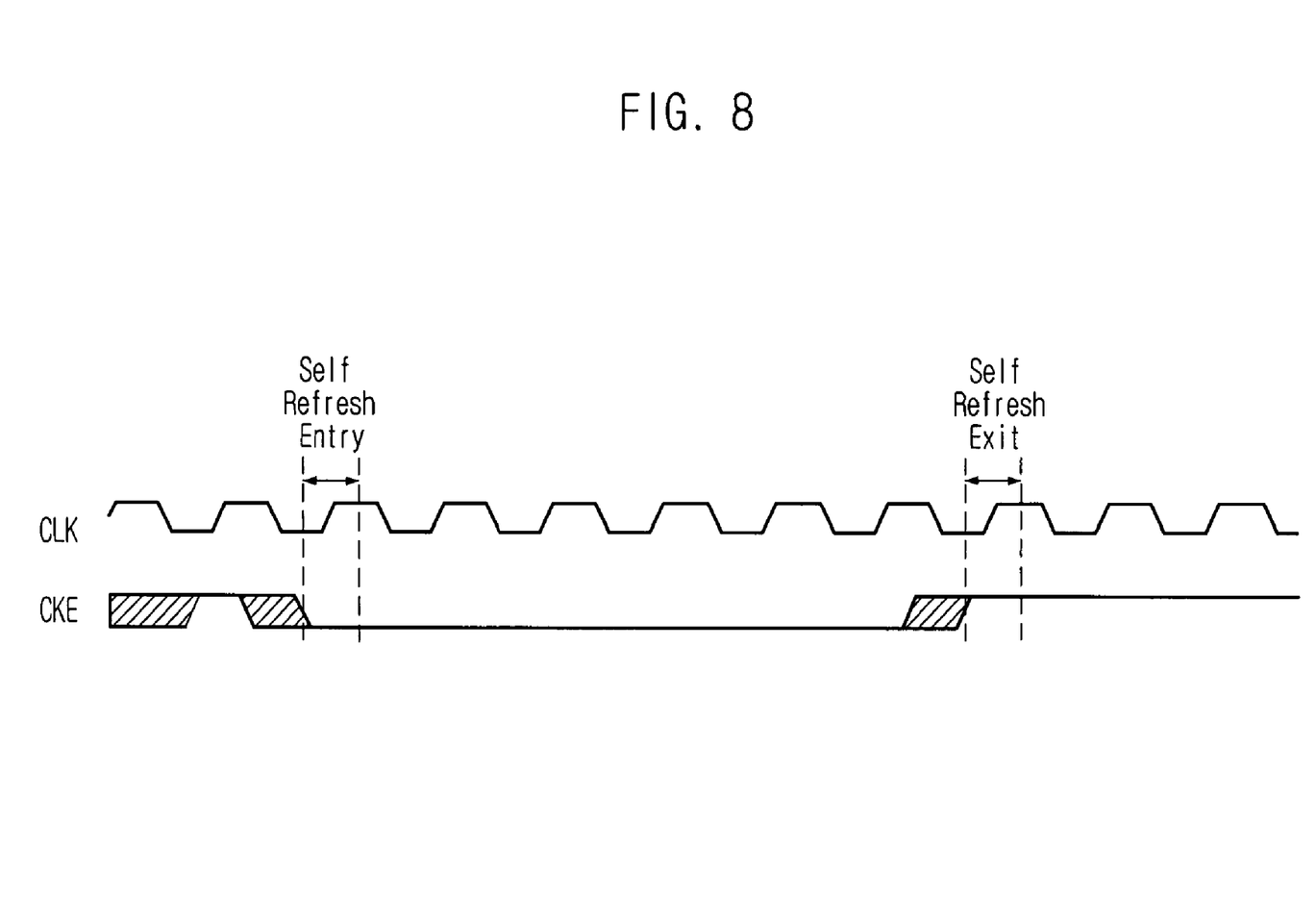
FIG. 8 illustrates an internal circuit diagram of the mode input/output controller of FIG. 4, to which an initialization signal is applied.

FIG. 8 exemplifies an internal circuit diagram of the mode input/output controller 100 of FIG. 4, indicated by reference numeral 100B, to which an initialization signal RST is applied.

Referring to FIG. 8, the mode input/output controller 100B that is stable upon an initial operation is composed of a self-refresh entry signal generator 160 for generating the self-refresh entry signal SREF_EN by sensing an inactivation of the clock enable signal CKE and initializing the signal SREF_EN upon receipt of the initialization signal RST, and a self-refresh escape signal generator 180 for producing the self-refresh escape signal SREF_EXP by sensing an activation of the clock enable signal CKE and initializing the signal SREF_EXP upon receipt of the initialization signal RST.

In comparison with the mode input/output controller 100B shown in FIG. 8 and that in FIG. 5, they have the same circuit configuration, but are different from each other in that the initialization signal RST is applied to each RS latch in the self-refresh entry signal generator 160 and the self-refresh escape signal generator 180 as a reset signal. Accordingly, when the initialization signal RST as the reset signal is activated to a logic low level, the self-refresh entry signal generator 160 and the self-refresh escape signal generator 180 are designed in such a way that the self-refresh entry signal SREF_EN has a logic low level and the self-refresh escape signal SREF_EXP has a logic high level.

Besides, an operation associated with the level transition of the clock enable signal CKE is made in the same manner as the conventional device, and thus, its detailed description will be omitted here for brevity.

As mentioned above, the mode input/output controller 100B according to another embodiment of the present invention as shown in FIG. 8 further receives the initialization signal RST, and thus permits the self-refresh entry signal SREF_EN and the self-refresh escape signal SREF_EXP to have more stable levels during the initial operation.

Meanwhile, the following is a detailed description of the self-refresh apparatus that allows an entry into the self-refresh mode from a test mode.

Figure 9:
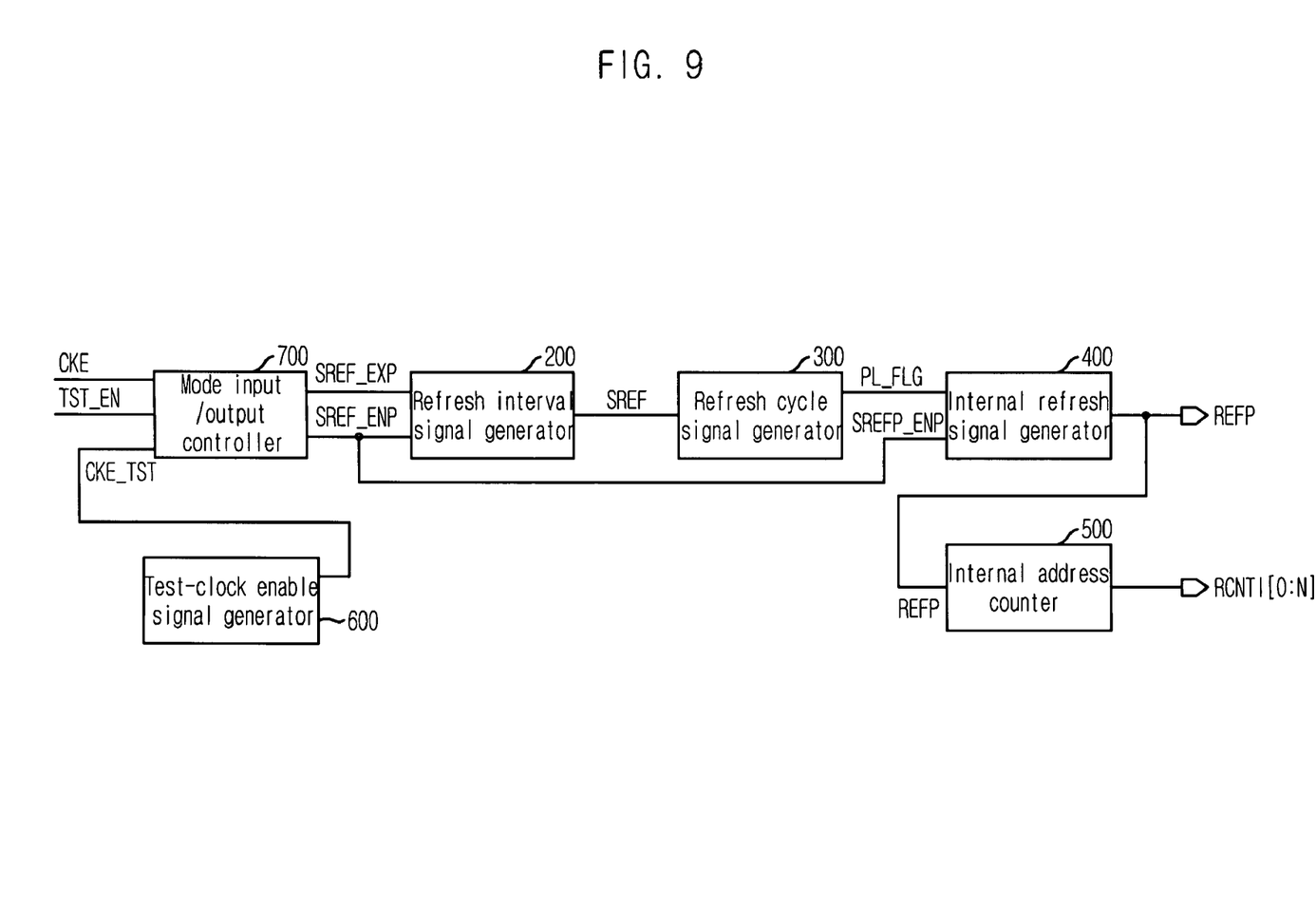
FIG. 9 illustrates a block diagram of a multi-port memory device having a self-refresh test mode in accordance with a second embodiment of the present invention.

FIG. 9 exemplifies a block diagram of a self-refresh apparatus having a test mode for a multi-port memory device in accordance with a second embodiment of the present invention.

Referring to FIG. 9, the self-refresh apparatus in accordance with the second embodiment of the present invention includes a test-clock enable signal generator 600 for providing a test-clock enable signal CKE_TST, a mode input/output controller 700 for receiving a clock enable signal CKE or the test-clock enable signal CKE_TST in response to a test signal TST_EN and generating a self-refresh entry signal SREF_EN and a self-refresh escape signal SREF_EXP, a refresh interval signal generator 200 for providing a self-refresh interval signal SREF notifying a self-refresh interval in response to the self-refresh entry signal SREF_EN and the self-refresh escape signal SREF_EXP, a refresh cycle signal generator 300 for periodically generating a cycle-pulse signal PL_FLG during an activation of the self-refresh interval signal SREF, an internal refresh signal generator 400 for producing an internal refresh signal REFP in response to the self-refresh entry signal SREF_EN and the cycle-pulse signal PL_FLG, and an internal address counter 500 for generating an internal address RCNTI[0:N] in response to the internal refresh signal REFP.

When compared with the first embodiment of the present invention shown in FIG. 4, the self-refresh apparatus of the second embodiment of the present invention further includes the test-clock enable signal generator 600 to thereby generate the test-clock enable signal CKE_TST. In addition, it can be seen that the self-refresh apparatus enters the self-refresh mode or escapes therefrom in response to the test-clock enable signal CKE_TST upon the test mode by applying the test signal TST_EN to the mode input/output controller 700. Accordingly, although the clock enable signal CKE is not applied upon the test, it is possible to test the self-refresh operation regardless of such state.

Further, upon a normal operation, the self-refresh apparatus has the same configuration as that of the first embodiment of the present invention which enters the self-refresh mode to perform the self-refresh by receiving the clock enable signal CKE from the outside. Therefore, in the following description, only the test-clock enable signal generator 600 and the mode input/output controller 700 will be discussed in detail.

Figure 10:
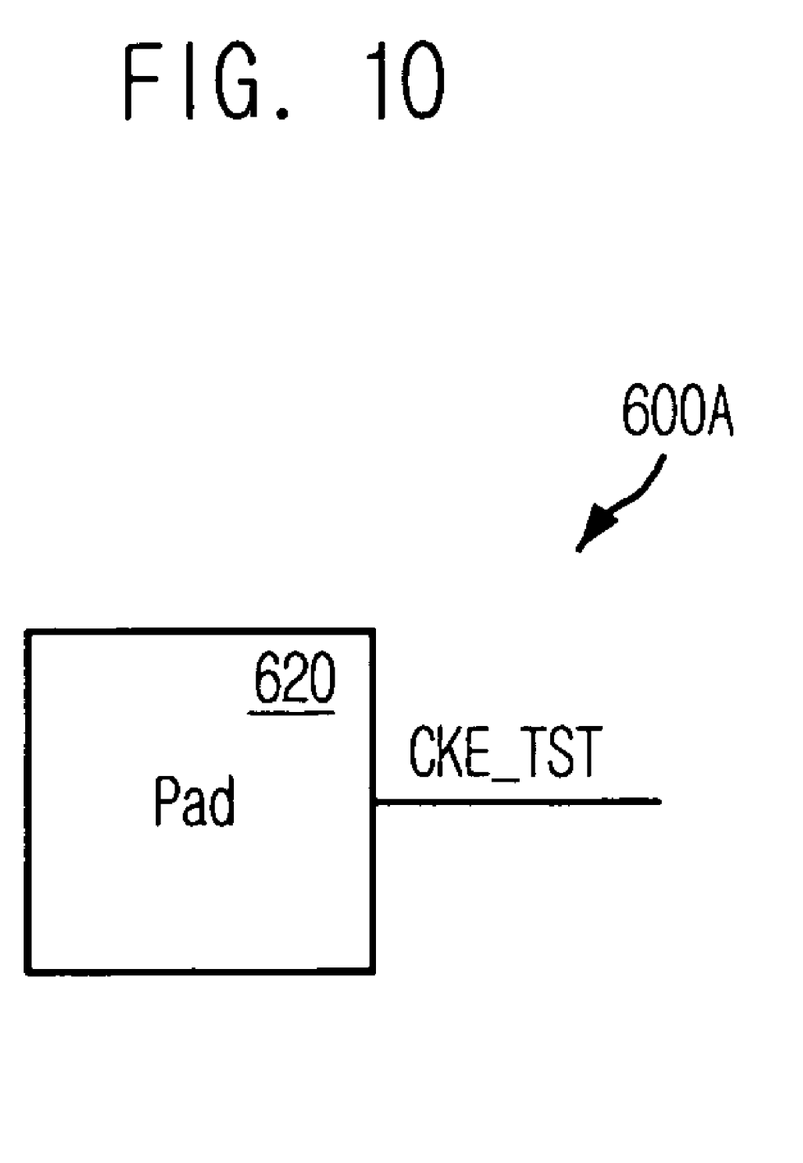
FIG. 10 illustrates an internal circuit diagram of the test-clock enable signal generator shown in FIG. 9.

FIG. 10 illustrates an internal circuit diagram of the test-clock enable signal generator 600 shown in FIG. 9, given as reference numeral 600A.

As shown therein, the test-clock enable signal generator 600A is a pad 620 that can accept the test-clock enable signal CKE_TST directly from the outside during the test.

Figure 11:
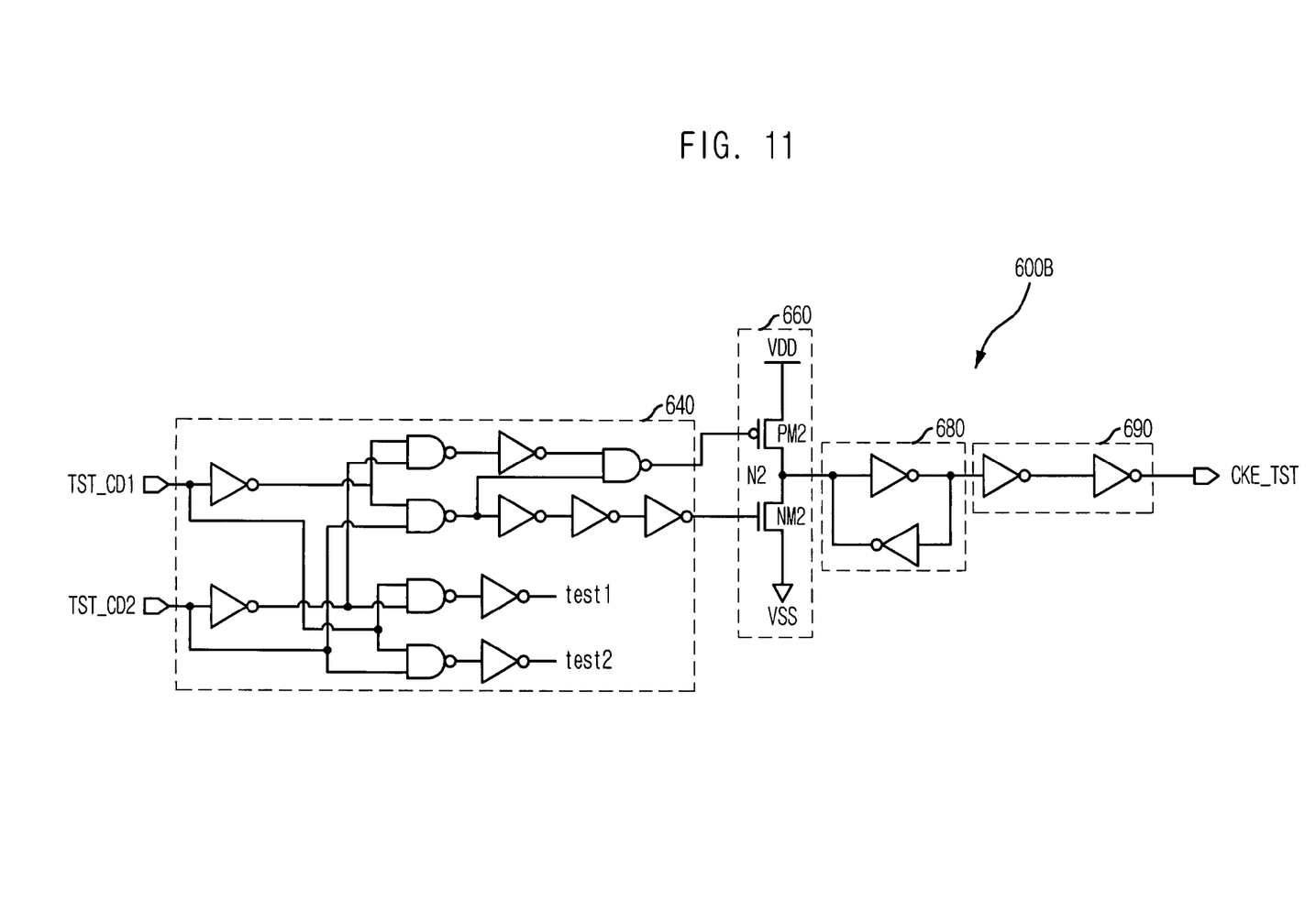
FIG. 11 is a circuit diagram exemplifying another embodiment of the test-clock enable signal generator shown in FIG. 9.

FIG. 11 exemplifies a circuit diagram of another embodiment of the test-clock enable signal generator 600 shown in FIG. 9, designated by reference numeral 600B.

Referring to FIG. 11, the test-clock enable signal generator 600B is composed of a decoder 640 for decoding test codes TST_CD1 and TST_CD2, a flag generator 660 for creating an output signal in response to output signals of the decoder 640, a latch 680 for inverting and latching the output signal of the flag generator 660, and a delay circuit 690 for delaying an output signal of the latch 680 to provide the test-clock enable signal CKE_TST.

As such, the test-clock enable signal generator 600B shown in FIG. 11 decodes the test codes TST_CD1 and TST_CD2 to produce the test-clock enable signal CKE_TST.

In other words, it can produce the test-clock enable signal CKE_TST through a combination of the test codes TST_CD1 and TST_CD2.

For reference, the output signals test1 and test2 of the decoder 640 may be employed for other operations during the test mode.

Figure 12:
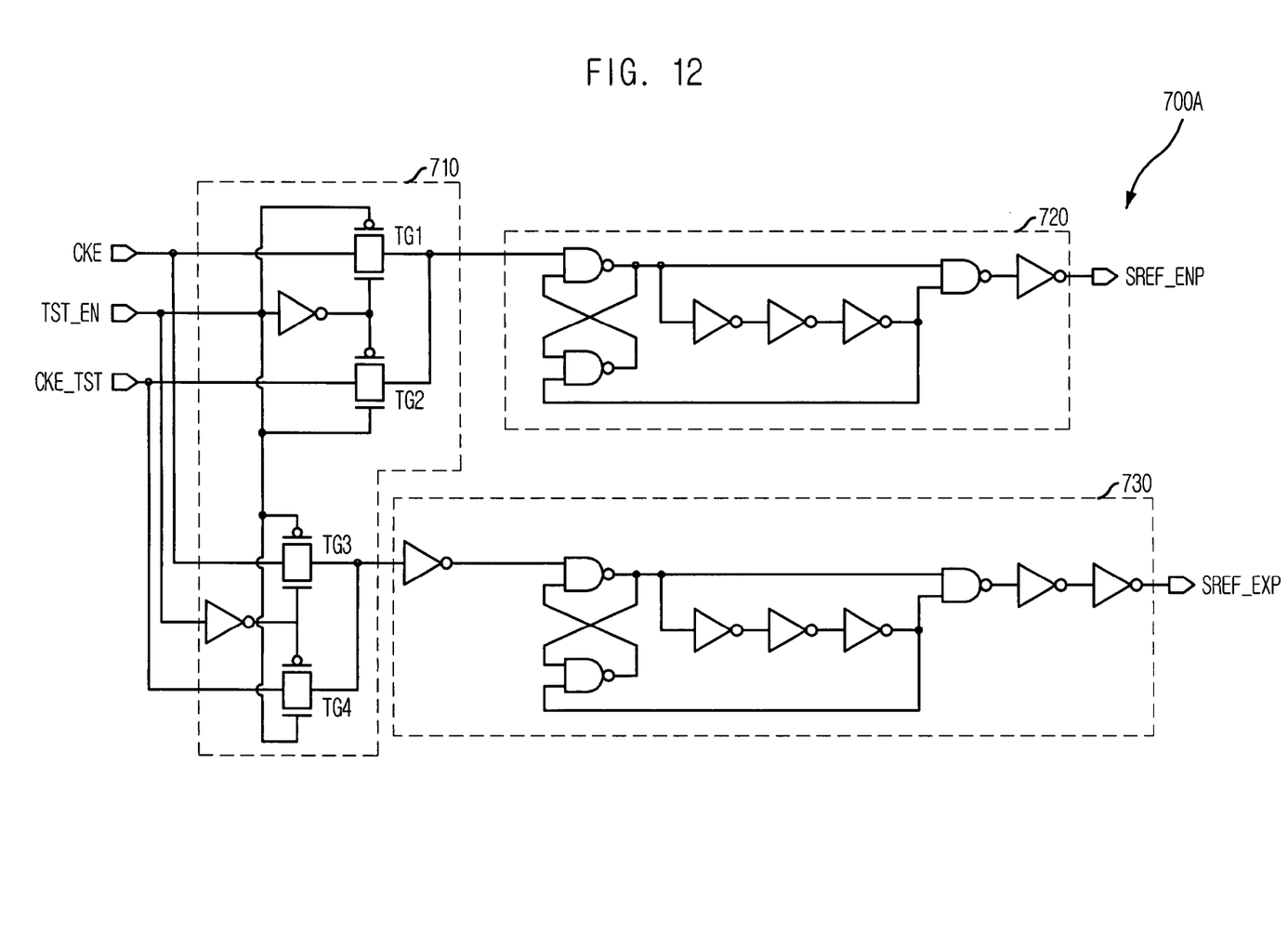
FIG. 12 illustrates an internal circuit diagram of the mode input/output controller shown in FIG. 9.

FIG. 12 exemplifies an internal circuit diagram of the mode input/output controller 700 of FIG. 9, indicated by reference numeral 700A.

Referring to FIG. 12, the mode input/output controller 700A is provided with a selector 710 for selectively providing the clock enable signal CKE or the test-clock enable signal CKE_TST in response to the test signal TST_EN, a self-refresh entry signal generator 720 for generating the self-refresh entry signal SREF_EN in response to an output signal of the selector 710, and a self-refresh escape signal generator 730 for providing the self-refresh escape signal SREF_EXP in response to the output signal of the selector 710.

When compared with the mode input/output controller 100A shown in FIG. 5, it can be seen that the mode input/output controller 700A of FIG. 12 further includes only the selector 710, and other blocks have the same configuration. Thus, only the selector 710 will be described in detail below.

The selector 710 is composed of a transfer gate TG1 for transferring the clock enable signal CKE to the self-refresh entry signal generator 720 in response to an inactivation of the test signal TST_EN, a transfer gate TG3 for transferring the clock enable signal CKE to the self-refresh escape signal generator 730 in response to the inactivation of the test signal TST_EN, a transfer gate TG2 for providing the test-clock enable signal CKE_TST to the self-refresh entry signal generator 720 in response to an activation of the test signal TST_EN, and a transfer gate TG4 for producing the test-clock enable signal CKE_TST to the self-refresh escape signal generator 730 in response to the activation of the test signal TST_EN.

Briefly explaining an operation, when the test signal TST_EN is inactivated, the selector 710 in which the transfer gates TG1 and TG3 become active applies the clock enable signal CKE to each of the self-refresh entry signal generator 720 and the self-refresh escape signal generator 730. Then, the self-refresh entry signal generator 720 activates the self-refresh entry signal SREF_EN when the clock enable signal CKE is transited to a logic low level, and the self-refresh escape signal generator 730 activates the self-refresh escape signal SREF_EXP when the clock enable signal CKE is transited to a logic high level.

Meanwhile, when the test signal TST_EN is activated, the selector 710 in which the transfer gates TG2 and TG4 become active applies the test-clock enable signal CKE_TST to each of the self-refresh entry signal generator 720 and the self-refresh escape signal generator 730. Then, the self-refresh entry signal generator 720 activates the self-refresh entry signal SREF_EN when the test-clock enable signal CKE_TST is transited to a logic low level, and the self-refresh escape signal generator 730 activates the self-refresh escape signal SREF_EXP when the test-clock enable signal CKE_TST is transited to a logic high level.

As described above, the self-refresh apparatus for the multi-port memory according to the second embodiment of the present invention performs the self-refresh in response to the test-clock enable signal CKE_TST that is received directly from the outside through the pad 600A or created through a combination of the test codes TST_CD1 and TST_CD2 in the test mode where the test signal TST_EN is activated. Namely, in the test mode, it is possible to test the self-refresh operation regardless of the on/off state of the input buffer for receiving the clock enable signal CKE.

Further, in the normal mode where the test signal TST_EN is inactivated, it can be seen that the normal self-refresh is performed in response to the clock enable signal CKE.

In the meantime, it is possible to stabilize levels of the self-refresh signal SREF_EN and the self-refresh escape signal SREF_EXP by accepting the initialization signal RST upon the initial operation. This will be described below in detail referring to the figure.

Figure 13:
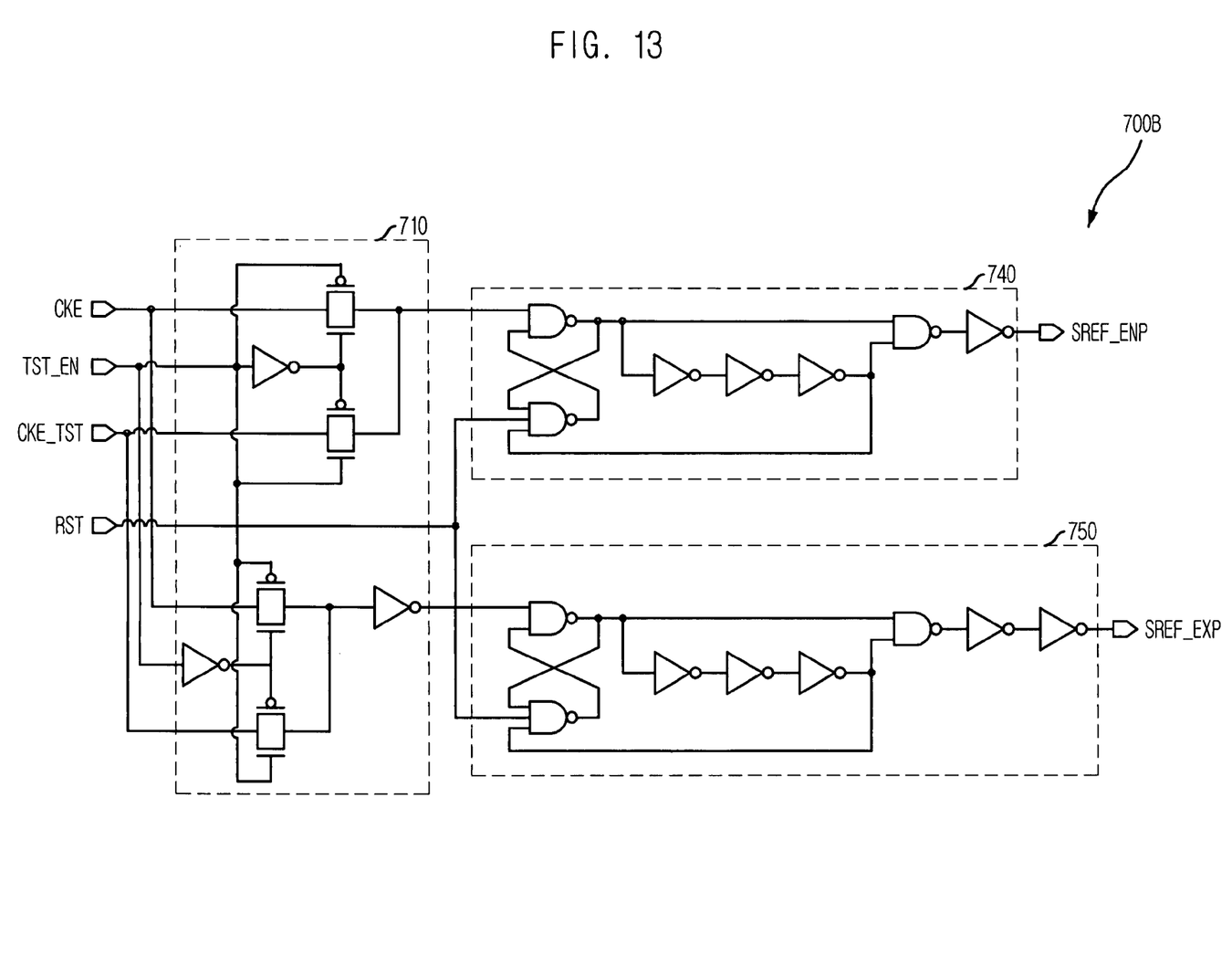
FIG. 13 offers an internal circuit diagram in accordance with another embodiment of the mode input/output controller shown in FIG. 9.

FIG. 13 illustrates an internal circuit diagram according to another embodiment of the mode input/output controller 700 shown in FIG. 9, designated by reference numeral 700B.

In comparison with the mode input/output controller 700A shown in FIG. 12, it can be found that the mode input/output controller 700B shown in FIG. 13 has the same circuit configuration but takes the initialization signal RST through the self-refresh entry signal generator 740 and the self-refresh escape signal generator 750.

Also, it can be known that the self-refresh entry signal generator 740 and the self-refresh escape signal generator 750 have the same circuit configuration as that shown in FIG. 6.

Accordingly, it can be seen that the mode input/output controller 700B according to another embodiment of the present invention, when the initialization signal RST is activated, inactivates the self-refresh entry signal SREF_EN to a logic low level and the self-refresh escape signal SREF_EXP to a logic high level, regardless of level of the clock enable signal CKE or the test-clock enable signal CKE_TST. Further, in the test mode, it is driven in the same way as in FIG. 12, and thus, details thereof will be omitted.

Therefore, the self-refresh apparatus having the test mode according to the second embodiment of the present invention illustrated in FIGS. 9 to 13 conducts the self-refresh in response to the test-clock enable signal CKE_TST which is received directly from the outside through the pad 600A or created through a combination of the test codes TST_CD1 and TST_CD2, in the test mode where the test signal TST_EN is activated. Namely, even in the test mode, it is possible to not only test the self-refresh operation but also test the same regardless of receipt or level change of the clock enable signal CKE.

Meanwhile, the self-refresh apparatuses for the multi-port memory device according to the first and the second embodiments of the present invention can enter the self-refresh or escape therefrom by only the clock enable signal CKE. Thus, the present invention has a simpler circuit configuration than that of the conventional device which should apply the clock enable signal CKE and the auto-refresh command AR together. Furthermore, the present invention can test the self-refresh operation even in the test mode.

In the present invention as set forth above, even though there is illustrated a case of entering the self-refresh mode in response to the inactivation of the clock enable signal and escaping therefrom in response to the activation thereof, it is not limited to a specific logic level of the clock enable signal or its substitution signal. For example, the present invention can enter the self-refresh mode during the activation of the clock enable signal and also escape therefrom during the inactivation thereof.

Further, in the present invention as mentioned above, although there is illustrated a case of entering the self-refresh mode in response to the logic level of the clock enable signal, it is merely one embodiment but not limited to such signal. For instance, it can be implemented to enter the self-refresh mode and escape therefrom in response to a single flag signal for an entry into the self-refresh mode.

Furthermore, in the present invention as set forth above, even though there is illustrated an example where the test-clock enable signal is generated by using the test codes of 2-bit, it should be noted that the aspect of the present invention is not limited to the number of bits of the test codes.

Moreover, although the new self-refresh apparatus for the multi-port memory device is illustrated in the present invention as described above, it should be noted that this can also be applied to the existing semiconductor memory devices.

As a result, the present invention can perform the self-refresh by only a single flag signal and also can test whether to perform such operation normally.

The present application contains subject matter related to Korean patent application Nos. 2005-90904 and 2006-49135 filed with the Korean Intellectual Property Office on Sep. 29, 2005 and May 31, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-port memory device comprising:
   a mode input/output controller for receiving a flag signal and generating a self-refresh entry signal and a self-refresh escape signal;
   a refresh interval signal generator for providing a self-refresh interval signal notifying a self-refresh interval in response to the self-refresh entry signal and the self-refresh escape signal;
   a refresh cycle signal generator for periodically generating a cycle-pulse signal during an activation of the self-refresh interval signal;
   an internal refresh signal generator for producing an internal refresh signal in response to the self-refresh entry signal and the cycle-pulse signal; and
   an internal address counter for generating an internal address in response to the internal refresh signal.

2. The multi-port memory device as recited in claim 1, wherein the mode input/output controller includes:
   a self-refresh entry signal generator for sensing an inactivation of the flag signal to provide the self-refresh entry signal; and
   a self-refresh escape signal generator for sensing an activation of the flag signal to produce the self-refresh escape signal.

3. The multi-port memory device as recited in claim 2, wherein the self-refresh entry signal generator includes:
   a first RS latch for taking the flag signal as a set signal and a first feedback signal as a reset signal;
   a first inversion delay circuit for delaying and inverting a positive output of the first RS latch to provide the first feedback signal;
   a first NAND gate for receiving and NAND-operating the positive output and the first feedback signal; and
   a first inverter for inverting an output signal of the first NAND gate to output the self-refresh entry signal.

4. The multi-port memory device as recited in claim 3, wherein the self-refresh escape signal generator includes:
   a second inverter for inverting the flag signal;
   a second RS latch for accepting an output signal of the second inverter as a set signal and a second feedback signal as a reset signal;
   a second inversion delay circuit for delaying and inverting a positive output of the second RS latch to provide the second feedback signal;
   a second NAND gate for receiving and NAND-operating the positive output and the second feedback signal; and
   a delay circuit for delaying an output signal of the second NAND gate to output the self-refresh escape signal.

5. A multi-port memory device comprising:
   a mode input/output controller for receiving a flag signal and generating a self-refresh entry signal and a self-refresh escape signal, both of which are inactivated in response to an initialization signal;
   a refresh interval signal generator for providing a self-refresh interval signal notifying a self-refresh interval in response to the self-refresh entry signal and the self-refresh escape signal;
   a refresh cycle signal generator for periodically generating a cycle-pulse signal during an activation of the self-refresh interval signal;
   an internal refresh signal generator for producing an internal refresh signal in response to the self-refresh entry signal and the cycle-pulse signal; and
   an internal address counter for generating an internal address in response to the internal refresh signal.

6. The multi-port memory device as recited in claim 5, wherein the mode input/output controller includes:
   a self-refresh entry signal generator for sensing an inactivation of the flag signal to thereby provide the self-refresh entry signal which is initialized upon receipt of the initialization signal; and
   a self-refresh escape signal generator for sensing an activation of the flag signal to thereby produce the self-refresh escape signal which is initialized upon receipt of the initialization signal.

7. The multi-port memory device as recited in claim 6, wherein the self-refresh entry signal generator includes:
   a first RS latch for taking the flag signal as a set signal and a first feedback signal as a reset signal;
   a first inversion delay circuit for delaying and inverting a positive output of the first RS latch to provide the first feedback signal;
   a first NAND gate for receiving and NAND-operating the positive output, the first feedback signal and the initialization signal; and
   a first inverter for inverting an output signal of the first NAND gate to provide the self-refresh entry signal.

8. The multi-port memory device as recited in claim 7, wherein the self-refresh escape signal generator includes:
   a second inverter for inverting the flag signal;
   a second RS latch for accepting an output signal of the second inverter as a set signal and a second feedback signal as a reset signal;
   a second inversion delay circuit for delaying and inverting a positive output of the second RS latch to provide the second feedback signal;
   a second NAND gate for receiving and NAND-operating the positive output, the second feedback signal and the initialization signal; and
   a delay circuit for delaying an output signal of the second NAND gate to output the self-refresh escape signal.

9. The multi-port memory device as recited in claim 8, wherein the refresh interval signal generator includes:
   a signal generator for activating an output signal in response to the self-refresh entry signal and inactivating the output signal in response to the self-refresh escape signal;

a latch for latching and outputting an output signal of the signal generator; and a third inverter for inverting the output signal of the signal generator to generate the self-refresh interval signal.

10. The multi-port memory device as recited in claim 9, wherein the signal generator includes:

a PMOS transistor whose gate takes the self-refresh entry signal and source-drain path is formed between an external voltage and an output node; and an NMOS transistor whose gate takes the self-refresh escape signal and drain-source path is formed between the output node and a ground voltage, a voltage on the output node being provided as the output signal.

11. A method for driving a multi-port memory device, comprising the steps of:

entering a self-refresh mode in response to an inactivation of a flag signal; and escaping from the self-refresh mode in response to an activation of the flag signal wherein the entering step includes:

generating an entry signal in response to the inactivation of the flag signal;

activating an interval signal in response to the entry signal;

activating a cycle-pulse signal at regular cycle intervals during the activation of the interval signal;

generating a new internal refresh signal for self-refresh execution in response to one of the entry signal and the cycle-pulse signal; and increasing a row address by one bit whenever the internal refresh signal is activated to thereby output an internal address.

\* \* \* \* \*